(12) United States Patent
Larson, III et al.

(10) Patent No.: US 7,615,833 B2
(45) Date of Patent: Nov. 10, 2009

(54) FILM BULK ACOUSTIC RESONATOR PACKAGE AND METHOD OF FABRICATING SAME

(75) Inventors: John D. Larson, III, Palo Alto, CA (US); Qing Bai, Sunnyvale, CA (US); Farid Matta, Los Altos, CA (US); Tracy Verhoeven, San Jose, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 170 days.

(21) Appl. No.: 10/890,343

(22) Filed: Jul. 13, 2004

(65) Prior Publication Data

US 2006/0012021 A1  Jan. 19, 2006

(51) Int. Cl.
*H01L 41/00* (2006.01)
(52) U.S. Cl. .............................. 257/416; 257/E29.324
(58) Field of Classification Search ................ 257/416, 257/E29.324, E21.613; 438/52
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandis et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |
| 4,456,850 A | 6/1984 | Inoue et al. |
| 4,529,904 A | 7/1985 | Hattersley |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |

(Continued)

FOREIGN PATENT DOCUMENTS

DE          10160617          6/2003

(Continued)

OTHER PUBLICATIONS

U.S. Appl. No. 10/458,131, entitled "Tunable Capacitor," filed Jun. 9, 2003.

(Continued)

*Primary Examiner*—Lex Malsawma (57) ABSTRACT

A microfabricated device has a first substrate, a second substrate, a film bulk acoustic resonator (FBAR) device, and a circuit. The second substrate is bonded to the first substrate to define a chamber. The FBAR device is located on a surface of the first substrate and inside the chamber. The circuit is located on a surface of the second substrate and inside the chamber. An electrical connection connects the circuit and the FBAR device.

18 Claims, 6 Drawing Sheets

U.S. PATENT DOCUMENTS

| | | | |
|---|---|---|---|
| 4,836,882 A | 6/1989 | Ballato | |
| 4,841,429 A | 6/1989 | McClanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,075,641 A | 12/1991 | Weber et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,166,646 A | 11/1992 | Avanic et al. | |
| 5,241,209 A | 8/1993 | Sasaki | |
| 5,241,456 A | 8/1993 | Marcinkiewicz et al. | |
| 5,262,347 A | 11/1993 | Sands | |
| 5,294,898 A | 3/1994 | Dworsky et al. | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Boloforosh | |
| 5,587,620 A | 12/1996 | Ruby et al. | |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,714,917 A | 2/1998 | Ella | |
| 5,835,142 A | 11/1998 | Nakamura et al. | |
| 5,853,601 A | 12/1998 | Krishaswamy et al. | |
| 5,864,261 A | 1/1999 | Weber | |
| 5,872,493 A | 2/1999 | Ella | |
| 5,873,153 A | 2/1999 | Ruby et al. | |
| 5,873,154 A | 2/1999 | Ylilammi et al. | |
| 5,894,647 A | 4/1999 | Lakin | |
| 5,910,756 A * | 6/1999 | Ella | 333/133 |
| 5,932,953 A | 8/1999 | Drees et al. | |
| 5,936,150 A | 8/1999 | Kobrin et al. | |
| 5,953,479 A | 9/1999 | Zhou et al. | |
| 5,982,297 A | 11/1999 | Welle | |
| 6,040,962 A | 3/2000 | Kiyosumi | |
| 6,051,907 A | 4/2000 | Ylilammi | |
| 6,060,818 A | 5/2000 | Ruby et al. | |
| 6,087,198 A | 7/2000 | Panasik | |
| 6,090,687 A | 7/2000 | Merchant et al. | |
| 6,107,721 A | 8/2000 | Lakin | |
| 6,111,480 A | 8/2000 | Iyama et al. | |
| 6,118,181 A | 9/2000 | Merchant et al. | |
| 6,124,756 A | 9/2000 | Yaklin et al. | |
| 6,150,703 A | 11/2000 | Cushman et al. | |
| 6,187,513 B1 | 2/2001 | Katakura | |
| 6,215,375 B1 | 4/2001 | Larson, III et al. | |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 * | 7/2001 | Bradley et al. | 333/133 |
| 6,265,246 B1 | 7/2001 | Ruby et al. | |
| 6,278,342 B1 | 8/2001 | Ella | |
| 6,292,336 B1 | 9/2001 | Cheng | |
| 6,307,447 B1 | 10/2001 | Barber et al. | |
| 6,307,761 B1 | 10/2001 | Nakagawa | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Akihiko | |
| 6,441,539 B1 | 8/2002 | Kitamura et al. | |
| 6,462,631 B2 | 10/2002 | Bradley et al. | |
| 6,466,105 B1 | 10/2002 | Lobl et al. | |
| 6,466,418 B1 | 10/2002 | Cheng | |
| 6,469,597 B2 | 10/2002 | Ruby et al. | |
| 6,469,909 B2 | 10/2002 | Simmons | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Larson, III et al. | |
| 6,486,751 B1 | 11/2002 | Barber et al. | |
| 6,489,688 B1 | 12/2002 | Baumann et al. | |
| 6,492,883 B2 | 12/2002 | Liang et al. | |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,528,344 B2 | 3/2003 | Kang | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panasik | |
| 6,549,394 B1 * | 4/2003 | Williams | 361/281 |
| 6,550,664 B2 | 4/2003 | Bradley et al. | |
| 6,559,530 B2 | 5/2003 | Hinzel et al. | |
| 6,564,448 B1 | 5/2003 | Oura et al. | |
| 6,566,979 B2 | 5/2003 | Larson et al. | |
| 6,580,159 B1 | 6/2003 | Fusaro et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,603,182 B1 | 8/2003 | Low et al. | |
| 6,617,249 B2 | 9/2003 | Ruby et al. | |
| 6,617,750 B2 | 9/2003 | Dummermuth et al. | |
| 6,617,751 B2 | 9/2003 | Sunwoo et al. | |
| 6,621,137 B1 | 9/2003 | Ma et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 | 12/2003 | Ella et al. | |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,713,314 B2 * | 3/2004 | Wong et al. | 438/25 |
| 6,714,102 B2 | 3/2004 | Ruby et al. | |
| 6,720,844 B1 | 4/2004 | Lakin | |
| 6,720,846 B2 | 4/2004 | Iwashita et al. | |
| 6,724,266 B2 | 4/2004 | Piazza et al. | |
| 6,998,940 B2 | 7/2004 | Metzger | |
| 6,774,746 B2 | 8/2004 | Whatmore et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta | |
| 6,874,211 B2 | 4/2005 | Bradley et al. | |
| 6,874,212 B2 | 4/2005 | Larson, III | |
| 6,888,424 B2 | 5/2005 | Takeuchi et al. | |
| 6,900,705 B2 | 5/2005 | Nakamura et al. | |
| 6,903,452 B2 | 6/2005 | Ma et al. | |
| 6,906,451 B2 | 6/2005 | Hajime | |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |

| | | |
|---|---|---|
| 6,936,954 B2 | 8/2005 | Peczalski |
| 6,946,928 B2 | 9/2005 | Larson et al. |
| 6,954,121 B2 | 10/2005 | Bradley et al. |
| 6,963,257 B2 | 11/2005 | Ella et al. |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 7,019,604 B2 | 3/2006 | Gotoh et al. |
| 7,019,605 B2 | 3/2006 | Larson et al. |
| 7,057,476 B2 | 6/2006 | Hwu |
| 7,084,553 B2 | 8/2006 | Ludwiczak |
| 7,091,649 B2 | 8/2006 | Larson |
| 7,098,758 B2 | 8/2006 | Wang et al. |
| 7,170,215 B2 | 1/2007 | Namba et al. |
| 7,173,504 B2 | 2/2007 | Larson |
| 7,187,254 B2 | 3/2007 | Su et al. |
| 7,230,509 B2 | 6/2007 | Stoemmer |
| 2002/0000646 A1 | 1/2002 | Gooch et al. |
| 2002/0030424 A1 | 3/2002 | Iwata |
| 2002/0070463 A1* | 6/2002 | Chang et al. ............... 257/780 |
| 2002/0121840 A1 | 9/2002 | Larson, III et al. |
| 2002/0121944 A1 | 9/2002 | Larson, III et al. |
| 2002/0121945 A1 | 9/2002 | Ruby et al. |
| 2002/0135440 A1 | 9/2002 | Ryhanen et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1* | 11/2003 | Lin et al. .................... 310/312 |
| 2004/0017130 A1 | 1/2004 | Wang et al. |
| 2004/0032012 A1 | 2/2004 | Wong et al. |
| 2004/0092234 A1 | 5/2004 | Pohjonen |
| 2004/0124952 A1 | 7/2004 | Tikka |
| 2004/0150293 A1 | 8/2004 | Unterberger |
| 2004/0150296 A1 | 8/2004 | Park et al. |
| 2004/0166603 A1* | 8/2004 | Carley ......................... 438/52 |
| 2004/0195937 A1 | 10/2004 | Matsubara et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson et al. |
| 2005/0093653 A1 | 5/2005 | Larson, III |
| 2005/0093654 A1 | 5/2005 | Larson et al. |
| 2005/0093655 A1 | 5/2005 | Larson et al. |
| 2005/0093657 A1 | 5/2005 | Larson et al. |
| 2005/0093658 A1 | 5/2005 | Larson et al. |
| 2005/0093659 A1 | 5/2005 | Larson et al. |
| 2005/0104690 A1 | 5/2005 | Larson |
| 2005/0110598 A1 | 5/2005 | Larson, III |
| 2005/0128030 A1 | 6/2005 | Larson et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206483 A1* | 9/2005 | Pashby et al. .............. 333/262 |
| 2005/0218488 A1 | 10/2005 | Mie |
| 2006/0087199 A1 | 4/2006 | Larson et al. |
| 2006/0103492 A1 | 5/2006 | Feng et al. |
| 2006/0125489 A1 | 6/2006 | Feucht et al. |
| 2006/0132262 A1 | 6/2006 | Fazzlo et al. |
| 2006/0164183 A1 | 7/2006 | Tikka |
| 2006/0185139 A1 | 8/2006 | Larson, III et al. |
| 2007/0084964 A1 | 4/2007 | Sternberger |
| 2007/0085447 A1 | 4/2007 | Larson |
| 2007/0085631 A1 | 4/2007 | Larson et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |
| 2007/0171002 A1 | 7/2007 | Unkrich |

FOREIGN PATENT DOCUMENTS

| | | |
|---|---|---|
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |
| EP | 1096259 | 5/2001 |
| EP | 1100196 | 5/2001 |
| EP | 1258990 | 11/2002 |
| EP | 1180494 | 3/2003 |
| EP | 1542362 | 6/2003 |
| EP | 1258989 | 1/2004 |
| EP | 1249932 | 3/2005 |
| EP | 1517443 | 3/2005 |
| EP | 1517444 | 3/2005 |
| EP | 1528674 | 5/2005 |
| EP | 1528675 | 5/2005 |
| EP | 1528677 | 5/2005 |
| EP | 1557945 | 7/2005 |
| EP | 1575165 | 9/2005 |
| GB | 1207974 | 10/1970 |
| GB | 2411239 | 8/2005 |
| GB | 2418791 | 4/2006 |
| JP | 2002/217676 | 8/2002 |
| WO | WO-98/16957 | 4/1998 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2005/043752 | 5/2005 |
| WO | WO-2005/043753 | 5/2005 |
| WO | WO-2005/043756 | 5/2005 |
| WO | WO-03/018788 | 2/2006 |

OTHER PUBLICATIONS

U.S. Appl. No. 10/158,005, entitled "Variable Capacitor Having a Rigidity-Increasing Feature and Method for Forming Same," filed Jun. 9, 2003.

Qing Bai, U.S. Appl. No. 10/723,095 entitled, "Device Having a Complaint Element Pressed Between Substrates," filed Nov. 26, 2003.

U.S. Appl. No. 10/971,169, filed Oct. 22, 2004, Larson, III, John D., et al.

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoelectric Transformers", *IEEE*, (2001),492-496.

Jiang, Yimin et al., "A Novel Single-Phase Power Factor Correction Scheme", *IEEE*, (1993),287-292.

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britian Patent Application", No. 0619698.4, Nov. 30, 2006.

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Schuessler, Hans H., "Ceramic Filters and Resonators", *Reprinted from IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", 0-7803-8331-1/4/W20.00; IEEE MTT-S Digest, (2004),927-929.

Parker, T. E., et al., "Temperature-Compensated Surface Acoustic-Wave Devices with SiO2 Film Overlays", *J. Appl. Physics*, vol. 50, (1360-1369),Mar. 1979.

Tsubbouchi, K. et al., "Zero Temperature coefficient Surface Acoustic Wave Devices using Epitaxial AIN Films", *IEEE Ultrasonic symposium*, San Diaego, CA, 1082, (1982),240-245.

Lakin, K. M., "Thin Film Resonators and Filters", *IEEE Untrasonics Symposium*, Caesar's Tahoe, NV, (Oct. 1999),895-906.

Lakin, K. M., et al., "Temperature Compensated Bulk Acoustic Thin Film Resonators", *IEEE Ultrasonics Symposium*, San Juan, Puerto Rico, (Oct. 2000),855-858.

Ohta, S. et al., "Temperature Characteristics of Solidly Mounted Piezoelectric Thin Film Resonators", *IEEE Ultrasonics Symposium*, Honolulu, HI, (Oct. 2003),2011-2015.

Bauer, L. O., et al., "Properties of Silicon Implanted with Boron Ions through Thermal Silicon Dioxide", *Solid State Electronics*, vol. 16, No. 3, (Mar. 1973),289-300.

Topich, J. A., et al., "Effects of Ion Implanted Flourine in Silicon Dioxide", *Nuclear Instr. And Methods*, Cecon Rec, Cleveland, OH, (May 1978),70-73.

Spangenberg, B. et al., "Dependence of the Layer Resistance of Boron Implantation in Silicon and the Annealing Conditions", *Comptus Rendus de l'Academic Bulgare des Sciences*, vol. 33, No. 3, (1980),325-327.

Hara, K. "Surface Treatment of Quartz Oscillator Plate by Ion Implantation", *Oyo Buturi*, vol. 47, No. 2, (Feb. 1978),145-146.

Ng, J. et al., "The Diffusion Ion-Implanted Boron in Silicon Dioxide", *AIP Conf. Proceedings*, No. 122, (1984),20-33.

Ruby, R. C., "Micro-Machined Thin Film Bulk Acoustic Resonators", *Proc. IEEE 48th, Symposium on Frequency control*, (1994),135-138.

Larson III, J. D., et al., "Measurement of Effective Kt2q,RpRs vs. Temperature for Mo/AIN/Mo Resonators", *2002 IEEE Ultrasonics Symposium*, Munich, Germany, (Oct. 2002),915-919.

Aoyama, T. et al., "Diffusion of Boron, Phosphorous, Arsenic and Antimony in Thermally Grown SiliconDioxide", *Fiujitsu Labs, J. Electromechanical Soc.*, vol. 146, No. 5, (1999),1879-1883.

Hadimioglu, B. et al., ""Polymer Films As Acoustic Matching Layers".", *1990 IEEE Ultrasonics Symposium Proceedings*, vol. 3 PP., [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007,(Dec. 1990),1337-1340.

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

"Search Report from corresponding application No.", GB 0605779.8, (Aug. 23, 2006).

"Examination Report from UK for application", GB 0605971.1, (Aug. 24, 2006).

Krishnaswamy, S.V. et al., "Film Bulk Acoustic Wave Resonator Technology", (May 29, 1990),529-536.

Lobl, H.P. et al., "Piezoelectric Materials For BAW Resonators And Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

Jung, Jun-Phil et al., "Experimental And Theoretical Investigation On The Relationship Between AIN Properties And AIN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AIN Film Using MOCVD For 5GHx Band FBAR Filter", *2003 IEEE Ultrasonics Symposium*, (Oct. 5, 2003),pp. 170-173.

Martin, Steven J., et al., "Development Of A Low Dielectric Constant Polymer For The Fabrication Of Integrated Circuit Interconnect", *12 Advanced Materials*, (Dec. 23, 2000),1769-1778.

"Examination report corresponding to application No.", GB0605770.7, (Aug. 25, 2006).

"Examination Report corresponding to application No.", GB0605775.6, (Aug. 30, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

Coombs, Clyde F., et al., "Electronic Instrument Handbook", *Second Edition, McGraw-Hill, Inc.*, (1995),pp. 5.1 to 5.29.

"A partial copy of GB Search Report for", *Application No. GB0522393.8*, (Jan. 9, 2006),4 pages.

"British Search Report Application No.", 0605222.9, (Jul. 11, 2006).

"A partial copy of GB Search Report for Application No.", GB0525884.3, (Feb. 2, 2006),4 pgs.

Auld, B. A., "Acoustic Resonators", *Acoustic Fields and Waves in Solids, Second Edition*, vol. II, (1990),250-259.

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys. 54* (10), (Oct. 1983),5893-5910.

"Search Report from corresponding application", No. GB0605225.2, (Jun. 26, 2006).

* cited by examiner

FIG. 5
(Bottom View)

FIG. 6

FIG. 7
(Top View)

FILM BULK ACOUSTIC RESONATOR PACKAGE AND METHOD OF FABRICATING SAME

RELATED ART

Film bulk acoustic resonator (FBAR) devices, such as FBAR-based duplexers used in mobile telephones and other mobile devices with radio frequency (RF) transmitters, are currently fabricated on a silicon (Si) substrate. An FBAR device is hermetically sealed inside a special miniature package composed of a base Si substrate on which FBARs are fabricated, a lid Si substrate covering the base substrate and a gasket between the substrates. The FBAR device package provides a very high packaging efficiency (volume ratio of the naked FBAR device to the packaged FBAR device). The FBAR device package is in turn mounted on a small but significant area of the main printed circuit board of the mobile telephone.

Mobile telephones and other RF devices have a separately-packaged RF power amplifier that typically employs high electron mobility transistors (HEMTs) built in and on a gallium arsenide (GaAs) substrate. The RF power amplifier package is mounted on another small but significant area of the printed circuit board of the mobile telephone.

The GaAs substrate used in the RF power amplifier packages is typically much more expensive than the Si substrate used in the FBAR packages. Thus, by fabricating the FBAR device and power amplifier in separate packages, the FBAR device does not consume valuable surface space on the gallium arsenide substrate of the power amplifier package. Further, the techniques used to manufacture the components of one of the packages are different and sometimes incompatible with the techniques used to manufacture the components of the other package. For the above reasons, it is generally considered cost effective and desirable to mount the FBAR device and the power amplifier in separate packages.

Mobile telephone and other portable devices employing RF transmitters have been subject to constant, substantial pressures from the market to (a) reduce size, and (b) increase the number of features. These market pressures have resulted in a reduction in the printed circuit board area available on one hand and an increase in the demand for printed circuit board area on the other.

What is needed therefore is a way to use the available printed circuit board area in a mobile telephone or other RF portable device more efficiently so that additional features can be provided using smaller printed circuit boards.

SUMMARY

Generally, embodiments of the present disclosure pertain to a microfabricated device having a film bulk acoustic resonator (FBAR) and a circuit packaged between a pair of bonded substrates. The FBAR device is located on one of the substrates, and the circuit is located on the other. The circuit is electrically connected to the FBAR device. Mounting the FBAR device and the circuit on the respective substrates of the package not only conserves valuable board space but also allows more freedom in the selection of substrate materials and manufacturing processes for the FBAR device and the circuit. In this regard, an optimum substrate material and/or manufacturing technique may be used for the FBAR device even if such material or manufacturing technique is incompatible with or undesirable for the circuit and vice versa.

A microfabricated device in accordance with an exemplary embodiment of the present disclosure has a first substrate, a second substrate, a film bulk acoustic resonator (FBAR) device, and a circuit. The second substrate is bonded to the first substrate to define a chamber. The FBAR device is located on a surface of the first substrate and inside the chamber. The circuit is located on a surface of the second substrate and inside the chamber. An electrical connection connects the circuit and the FBAR device.

A method for manufacturing a microfabricated device in accordance with an exemplary embodiment of the present disclosure comprises: providing first and second substrates; forming a film bulk acoustic resonator (FBAR) device on a surface of the first substrate; forming a circuit on a surface of the second substrate; and bonding the first and second substrates together to define a chamber in which the FBAR device and the circuit are located. The bonding electrically connects the FBAR device to the circuit.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present invention is based on the inventors' realization that the miniature FBAR package, efficient as it is, contains unused area, namely, the lid substrate, that could be used to mount other components. Moreover, in a conventional FBAR package, the material of the lid substrate is a semiconductor, so active devices can be fabricated in and on the lid substrate and can be located inside the chamber that also houses the FBAR device. The inventors have realized that, by locating the FBAR device on the lid substrate, and using GaAs as the material of the base substrate, the power amplifier can be fabricated on the base substrate while the FBAR device is fabricated on the lid substrate. The output of the power amplifier can be electrically connected directly to the transmitter port of the FBAR duplexer. With this structure, the FBAR device and the power amplifier occupy a common area of the main printed circuit board, which makes the printed circuit board area formerly occupied by the RF power amplifier package available for use by other circuits, or to provide a reduction in size.

Figure 1:
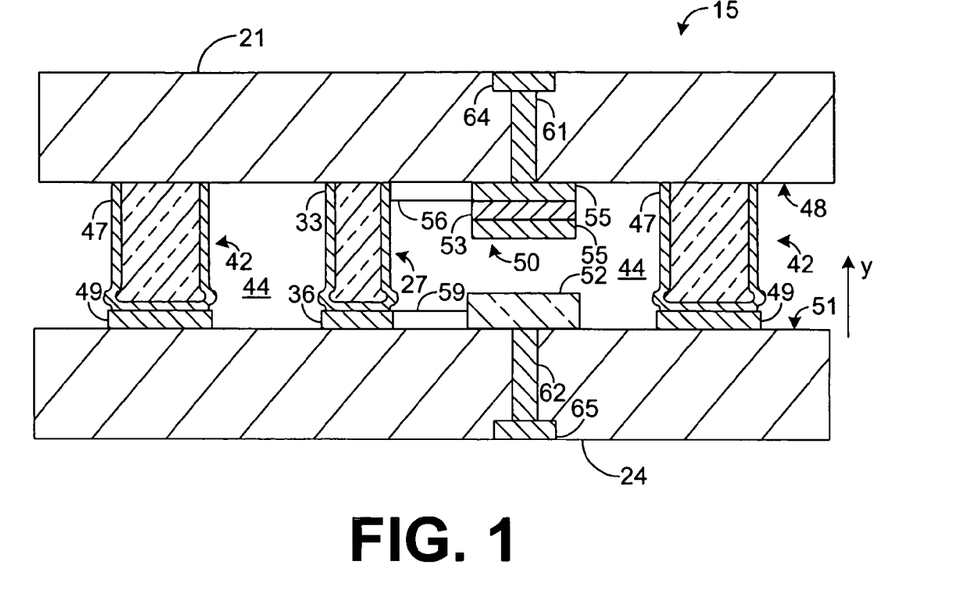
FIG. 1 is a cross-sectional view of a device fabricated in accordance with an exemplary embodiment of the present disclosure.

FIG. 1 depicts a microfabricated device 15 in accordance with an exemplary embodiment of the present disclosure. As shown by FIG. 1, the device 15 has a first substrate 21, referred to hereafter as "lid substrate," bonded to a second substrate 24, referred to hereafter as "base substrate." In one embodiment, each of the substrates 21 and 24 is composed of silicon. However, as will be described below, the substrates 21 and 24 may be composed of other materials in other embodiments. The device 15 shown by FIG. 1 has at least one electrically conductive post 27 that extends between and provides an electrical connection between the two substrates 21 and 24.

Various configurations of the post 27 are possible. In the exemplary embodiment depicted by FIG. 1, the electrically conductive post 27 is composed of a compliant material, such as polyimide or other type of a compliant polymer, for example. Polymers have typically been used in conventional microfabricated devices as stress relief layers or a bonding material. However, polymers are generally poor electrical conductors and have not previously been used to provide an electrical connection between the substrates of microfabricated devices.

At least a portion of the post 27 is coated with a layer 33 of an electrically conductive material. As will be described in more detail below, the post 27 is formed on lid substrate 21 before the two substrates 21 and 24 are bonded together, and an electrically conductive pad 36 for contacting the post 27 is formed on base substrate 24. The conductive pad 36 helps form an electrical connection between the two substrates 21 and 24 by providing a relatively wide, electrically conductive region to make electrical contact with the post 27 when the device 15 is assembled. The conductive pad 36 may be located on the surface of the base substrate 24 or may be formed in the substrate 24 by etching the substrate's surface before depositing the pad 36. The post 27 is electrically coupled to circuitry or a micro-electro-mechanical system (MEMS) device residing on or in either of the substrates 21 or 24, as will be described in more detail below.

A gasket 42 extends around the periphery of the device 15, and provides a hermetic seal for a chamber 44 within the device 15. As used herein, a gasket that also provides a hermetic seal for a chamber will be referred to as a "hermetic gasket." Various configurations of the gasket 42 are possible. For example, commonly-assigned U.S. Pat. Nos. 6,090,687 and 6,118,181, which are both incorporated herein by reference, describe techniques that may be used to form a gasket that provides a hermetic seal. In the exemplary embodiment shown by FIG. 1, the gasket 42 is composed of a compliant material, such as polyimide or other type of a compliant polymer. As described above, polymers have typically been used in conventional microfabricated devices as stress relief layers or a bonding material. However, polymers are non-hermetic and have not generally been used to form hermetic seals.

At least a portion of the gasket 42 is coated with a layer 47 of a sealing material, such as gold, copper, glass, or silicon nitride. Coating the polymer with the sealing material enables the gasket 42 to form a hermetic seal. The gasket 42 can be of any desired shape (e.g., circle, square, rectangle, etc.). If desired, a pad 49 similar in shape to gasket 42 may be formed on the base substrate 24 to make contact with the gasket 42 when the device 15 is assembled.

As briefly described above, the post 27 provides an electrical connection between the substrates 21 and 24. As an example, in the device 15 shown by FIG. 1, the post 27 provides an electrical connection between an FBAR device 50 formed on the surface 48 of the lid substrate 21 and an associated circuit 52 formed on the surface 51 of the base substrate 24. The FBAR device 50 is composed of one or more acoustically or electrically interconnected FBARs. In the example shown in FIG. 1, the FBAR device 50 has a piezoelectric layer 53, such as aluminum nitride, situated between two metal electrode layers 55. An electrically-conductive trace 56 formed on the lid substrate 21 electrically couples the FBAR device 50 to the post 27. Further, an electrically-conductive trace 59 formed on the base substrate 24 electrically couples the associated circuit 52 to the conductive pad 36. Thus, the FBAR device 50 is electrically connected to the circuit 52 by post 27, conductive pad 36, and traces 56 and 59.

In addition, the FBAR device 50 and the circuit 52 are electrically connected to devices external to the hermetic chamber 44. In FIG. 1, a via 61 composed of electrically conductive material provides an electrical connection between the FBAR device 50 and devices (not shown) external to the microfabricated device 15. Similarly, a via 62 composed of electrically conductive material provides an electrical connection between the circuit 52 and devices (not shown) external to the device 15. To help ensure a low resistance electrical contact between the external devices and vias 61 and 62, relatively wide, electrically conductive pads 64 and 65 are formed on the substrates 21 and 24, respectively. In other embodiments, connections other than the ones shown may provide an electrical connection from the FBAR device 50 and the circuit 52 to components external to the device 15.

Figure 2:
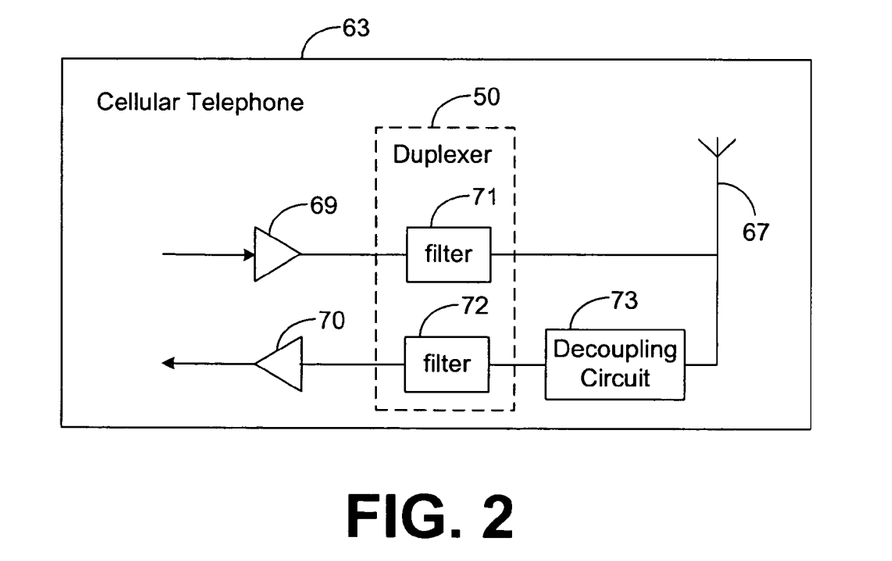
FIG. 2 is a block diagram illustrating a cellular telephone that is composed of the device depicted in FIG. 1.

The circuit 52 is composed of electrical components not individually shown in FIG. 1 and processes signals transmitted to or received from the FBAR device 50. FIG. 2 shows an example in which the FBAR device 50 is the duplexer of a cellular telephone. FIG. 2 shows an exemplary cellular telephone 63 having an antenna 67, an FBAR device 50 configured as a duplexer, a power amplifier 69, and a low-noise amplifier (LNA) 70. The duplexer 50 has a pair of band-pass filters 71 and 72. The band-pass filter 71 is electrically connected between the antenna 67 and the output of the power amplifier 69, and the band-pass filter 72 is electrically connected in series with decoupling circuit 73, such as a quarter wave delay line, to provide isolation between the output of power amplifier 69 and the input of LNA 70. The power amplifier 69 amplifies a transmit signal that is to be transmitted by the cellular telephone 63. The band-pass filter 71 has a pass-band centered on the frequency range of the transmit signal and allows the transmit signal to pass to antenna 67. The band-pass filter 72 has a pass-band centered on the frequency range of a receive signal from the antenna 67. The stop band of the filter 71 overlaps the pass-band of the filter 72, and the stop band of the filter 72 overlaps the pass-band of the filter 71. Thus, the duplexer 50 keeps the receive signal amplified by low-noise amplifier 70 free of interference from the transmit signal. In FBAR device 50, each of the band-pass filters 71 and 72 is composed of FBARs interconnected as a ladder filter. The circuit 52 may provide either of the amplifiers 69 or 70.

The circuit 52 and FBAR device 50 may perform other functions in other embodiments. The use of the microfabricated device 15 in a cellular telephone 63 has been described above merely for illustrative purposes, and the microfabricated device 15 may be implemented in other types of products. Further, the FBAR device 50 may perform functions other than duplexing, and the circuit 52 may process signals received from or transmitted to the FBAR device 50 in ways other than those specifically described herein.

An exemplary process for forming the device 15 will now be described. Although the fabrication of a single device 15 will be described, the processes to be described are typically applied to wafers from which thousands of devices identical to device 15 are formed.

Figure 3:
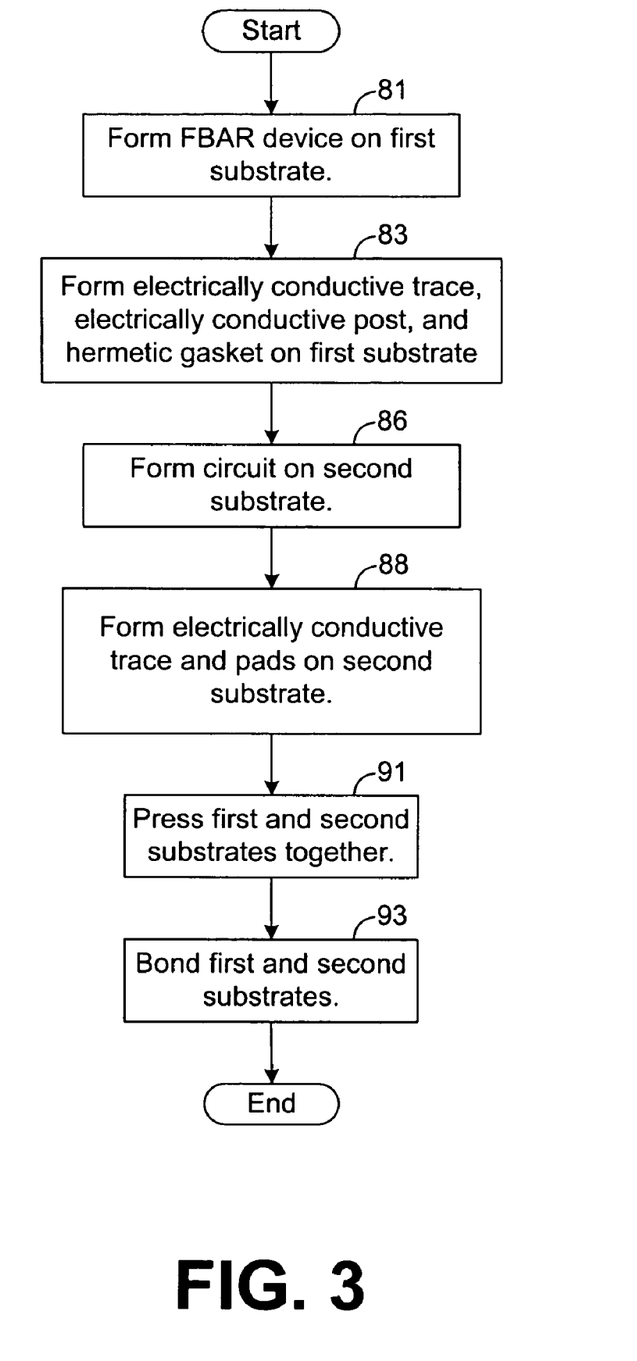
FIG. 3 is flow chart illustrating an exemplary methodology for fabricating the device depicted in FIG. 1.

Vias 61 and 62 are respectively formed in substrates 21 and 24 by photolithography and etching or some other suitable fabrication technique. As previously described, via 61 is composed of electrically conductive material, such as copper or gold. In the example described above, via 61 electrically connects FBAR device 50 to an external device (e.g., to the antenna 67 of FIG. 2). Further, via 62 is composed of electrically conductive material and electrically connects circuit 52 to an external device. The vias 61 and 62 may be formed at any time during the fabrication process. For example, the vias 61 and 62 may be formed, as shown by FIG. 3, before other components are formed on substrates 21 and 24. In an alternative embodiment, the vias 61 and 62 may be formed after the substrates 21 and 24 have been bonded, as will be described below.

As depicted by block 81 of FIG. 3, the FBAR device 50 is formed on lid substrate 21. The FBAR device 50 is formed on substrate 21 by depositing and patterning a layer of metal, a layer of piezoelectric material, and a layer of metal to form layers 55, 53, and 55, respectively. In one embodiment, the material of metal layers 55 is molybdenum (Mo), and the material of piezoelectric layer 53 is aluminum nitride.

Figure 4:
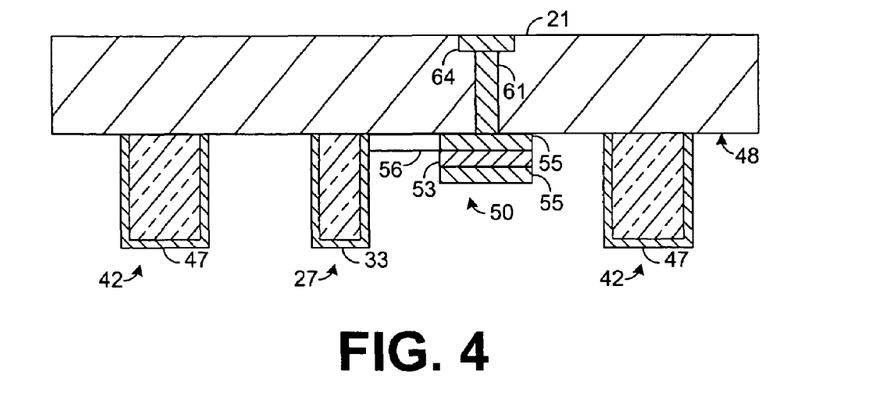
FIG. 4 is a cross-sectional view of a lid substrate having a film bulk acoustic resonator (FBAR), a compliant connection, and a compliant gasket formed on a surface of the lid substrate.
Figure 5:
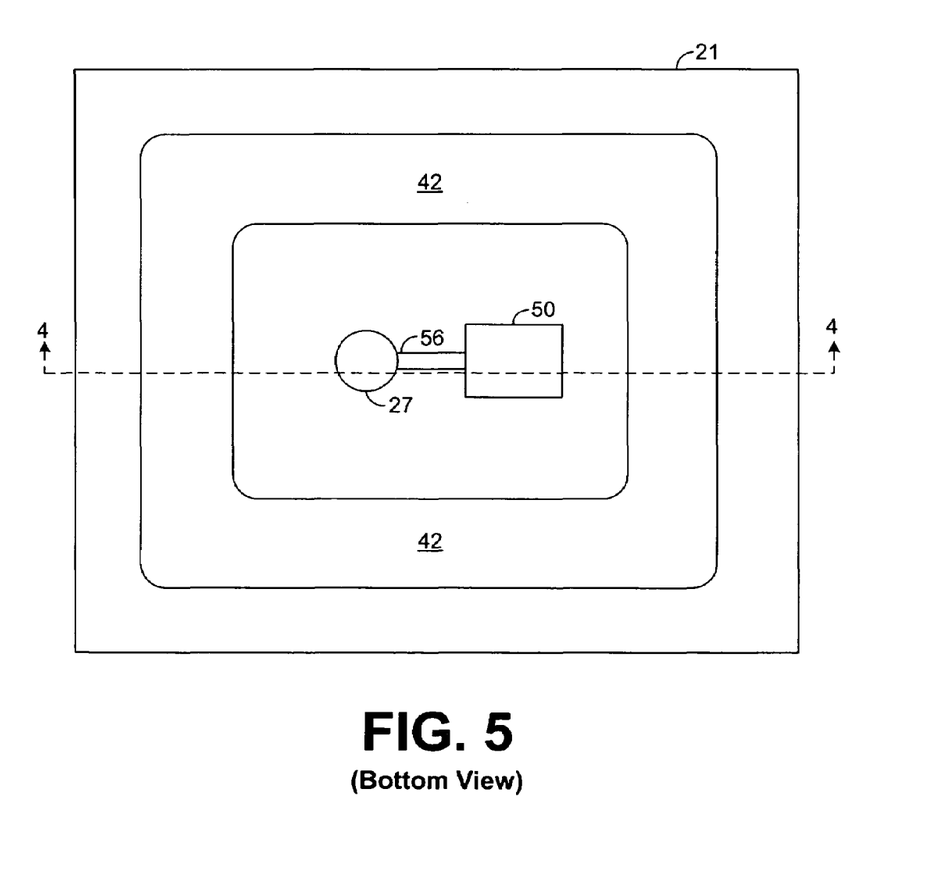
FIG. 5 is a bottom view of the lid substrate depicted in FIG. 3.

As depicted by block 83 of FIG. 3 and FIGS. 4 and 5, the electrically conductive post 27, the gasket 42, and the electrically conductive trace 56 are also formed on lid substrate 21. The electrically conductive trace 56 is formed on the lid substrate 21 using material deposition, photolithography, and etching or some other suitable fabrication technique. The material of trace 56 is gold or some other electrically conductive material. The post 27 and gasket 42 are formed by depositing a layer of compliant material, such as polyimide, on the surface 48 of substrate 21. Using photolithography and etching, the layer of compliant material is patterned to define the post 27 and gasket 42, which are then coated with an electrically conductive material. To coat the post 27 and gasket 42, a seed layer (e.g., titanium) is first sputtered on the post 27 and gasket 42. Then, electrically conductive material, such as gold, is electroplated on the seed layer.

FIG. 5 shows the post 27 as having a generally circular cross-sectional shape. However, the post 27 may have other shapes in other embodiments. Commonly-assigned U.S. patent application Ser. No. 10/723,095, entitled "Device having a Compliant Element Pressed between Substrates," filed on Nov. 26, 2003, which is incorporated herein by reference, describes exemplary techniques that may be used to form the post 27 and gasket 42.

Figure 6:
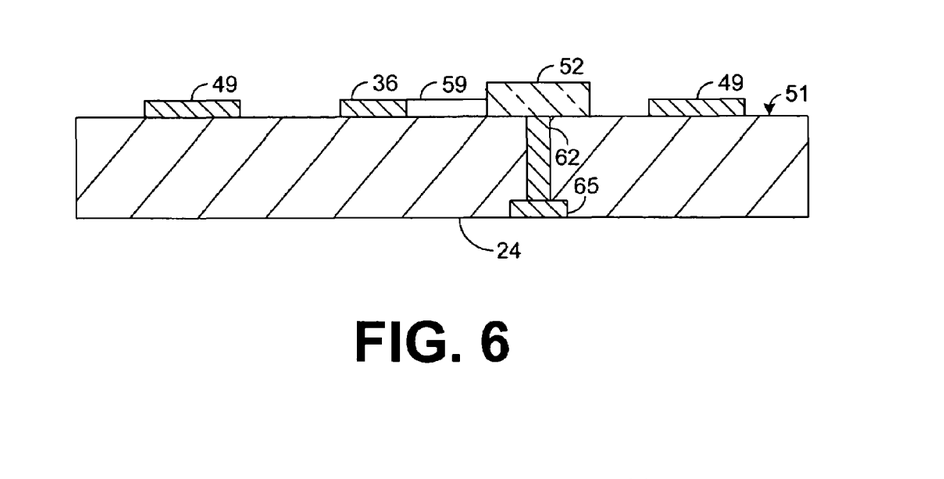
FIG. 6 is a cross-sectional view of a base substrate to be bonded to the lid substrate depicted in FIG. 4.
Figure 7:
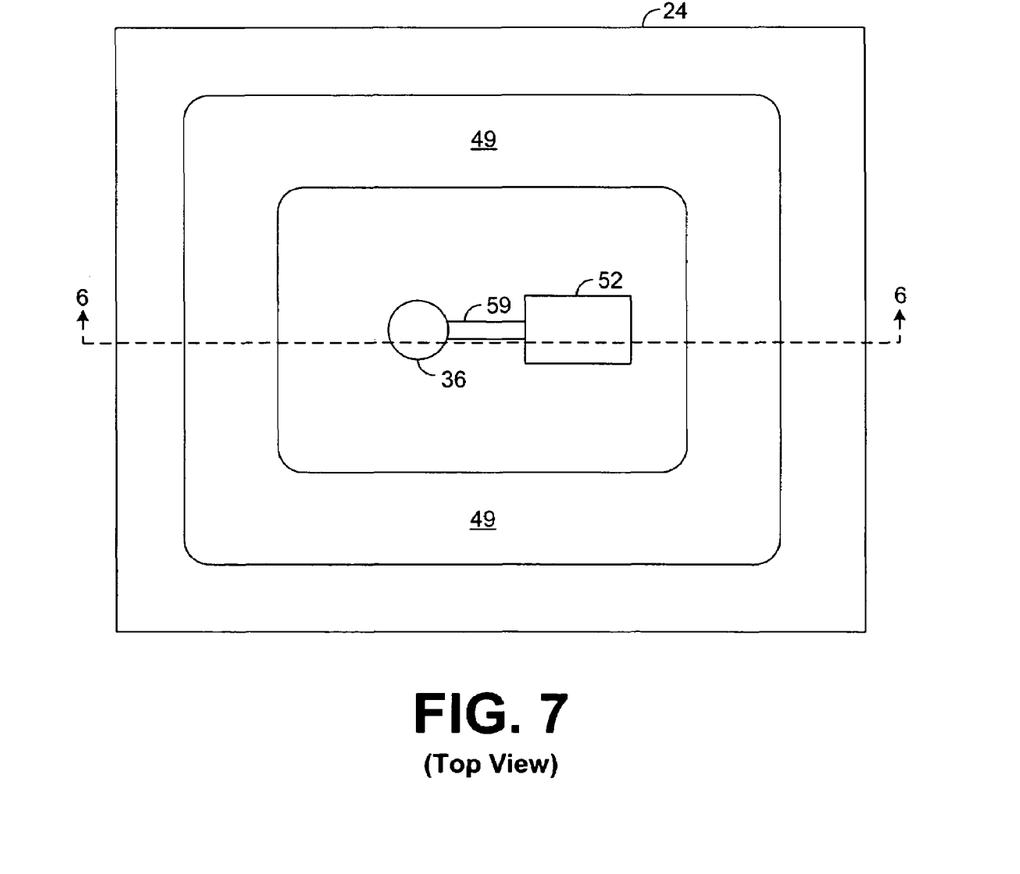
FIG. 7 is a top view of the base substrate depicted in FIG. 6.

As shown by block 86 of FIG. 3, as well as FIGS. 6 and 7, the circuit 52 is formed on the surface 51 of the base substrate 24 using any suitable fabrication technique. As depicted by block 88 of FIG. 3, the electrically conductive trace 59 and pads 36 and 49 are formed on the surface 51 of the base substrate 24 using material deposition, photolithography, and etching or some other suitable fabrication technique. The material of the electrically conductive trace and pads is gold or some other electrically conductive material. As can be seen by comparing FIGS. 5 and 7, the shapes of the pads 36 and 49 respectively correspond to the shapes of the post 27 and gasket 42. However, it is possible for the pads 36 and 49 to have shapes different from those of the post 27 and gasket 42.

As depicted by blocks 91 and 93 of FIG. 3, the base substrate 24 is pressed against and bonded to the lid substrate 21. In particular, the substrates 21 and 24 are aligned with the post 27 in contact with pad 36 and with the gasket 42 in contact with pad 49 and are pressed together. The compliant material of the post 27 enables the post 27 to deform without fracturing or otherwise failing as the substrates 21 and 24 are pressed together. Further, the compliant material of the gasket 42 enables the gasket 42 to deform without fracturing or otherwise failing as the substrates 21 and 24 are pressed together. The substrates 21 and 24 may be bonded while being pressed together. Various known or future-developed bonding techniques may be used to bond substrates 21 and 24, such as thermal compression bonding or solder bonding.

In one embodiment, the electrically conductive material used to coat the post 27 and gasket 42 is gold (Au). In such an embodiment, before the substrates 21 and 24 are bonded using solder bonding, a layer of tin (Sn) is deposited on the gold-coated post 27 and gasket 42. Then, to bond the substrates 21 and 24 using solder bonding, the substrates 21 and 24 are pressed together until the post 27 and gasket 42 make intimate contact with the base substrate 24, and the device 15 is heated until the gold and tin material on the post 27 and gasket 42 begins to melt causing this material to diffuse and adhere to the base substrate 24. Heating of the device 15 is then stopped and the substrates 21 and 24 are allowed to cool. The melted gold and tin material hardens as the device 15 cools, and the hardened material forms a bond between the base substrate 24 and the post 27, as well as gasket 42, of the lid substrate 21. The introduction of tin to the gold-coated post 27 and gasket 42, as described above, helps to form a stronger bond during the solder bonding.

The compliant materials of the post 27 and the gasket 42 help ensure that the post 27 and gasket 42 intimately contact the base substrate 24. In this regard, the compliant materials of the post 27 and the gasket 42 allow the post 27 and the gasket 42 to deform until the post 27 and the entire periphery of the gasket 42 come into contact with the base substrate 24. As an example, due to imperfections in the fabrication of post 27 and gasket 42, it is possible for the gasket 42 to contact pad 49 before post 27 contacts pad 36. In such a situation, the gasket 42 deforms to allow the substrates 21 and 24 to be further pressed together until the post 27 makes intimate contact with pad 36. Similarly, the post 27 or portions of the gasket 42 may deform to allow the entire periphery of the gasket 42 to make intimate contact with pad 49. Ensuring intimate contact between the post 27 and the pad 36 and between the gasket 42 and the pad 49 during bonding helps to ensure that the post 27 provides a reliable, low-impedance electrical conduction between the substrates 21 and 24 and that the gasket 42 provides a reliable hermetic seal for the chamber 44.

After assembly of device 15, the base substrate 24 may be thinned, if desired, to reduce its thickness and provide better heat dissipation for the circuit 52. Any suitable fabrication technique for thinning the substrate 24, such as back-lapping or polishing, for example, may be used to thin the substrate 24. In one embodiment, the lid 21 provides sufficient structural support so that the substrate 24 can be thinned with less concern for breakage or mechanical integrity.

Figure 8:
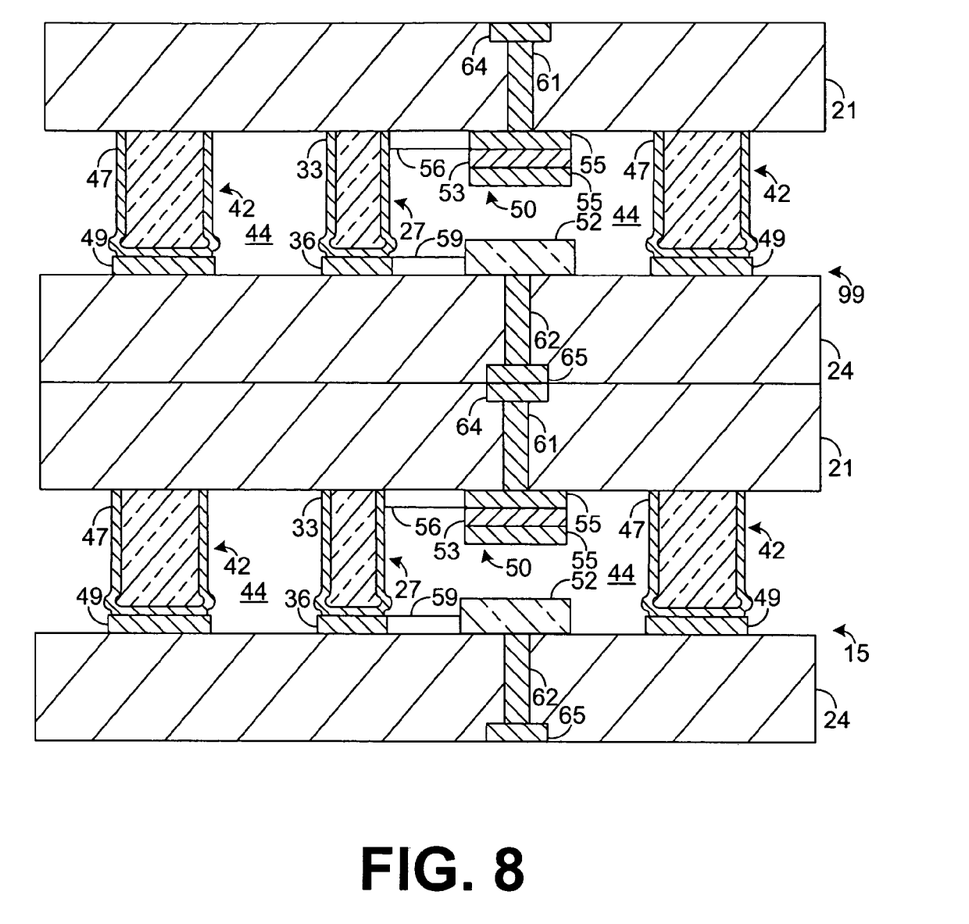
FIG. 8 is a cross-sectional view of the device depicted by FIG. 1 stacked on another device.

As described above, the vias 61 and 62 provide an electrical connection to other devices or substrates external to or stacked on the device 15. For example, FIG. 8 shows a second microfabricated device 99 stacked on the device 15 shown in FIG. 1. In the example shown in FIG. 8, the configuration of the device 99 is identical to the configuration of the device 15. Typically, device 99 has a configuration different from that of the device 15. The electrical connection between the via 61 of device 15 and via 62 of device 99 enables the circuit 52 of device 99 to communicate with the FBAR device 50 of device 15.

It is unnecessary for either or both of the post 27 and the gasket 42 to be formed on the same substrate 21 as the FBAR device 50. Either or both of the post 27 and the gasket 42 may be formed on the base substrate 24. In this case, pads similar to pads 36 and 49 are formed on lid substrate 21. The post 27 and/or gasket 42 is then pressed against the pads located on lid substrate 21 during bonding. In a further variation, the FBAR device 50 is formed on the base substrate 24, and the circuit 52 is formed on the lid substrate 21. Forming the FBAR device 50 and the circuit 52 on different substrates allows the FBAR device 50 and the circuit 52 to be formed using respective fabrication techniques that are incompatible with one another. For example, by forming the FBAR device 50 on the lid substrate 21, the FBAR device 50 may be fabricated by a process incompatible with that used to fabricate the components on the base substrate 24. Thus, an optimum process for fabricating the FBAR device 50 may be used even if such process is incompatible with components (e.g., circuit 52) on the base substrate 24.

In one embodiment, the gasket 42 is coated with a material, such as gold or copper, that not only seals the gasket 42 but is also electrically conductive. In such an embodiment, the gasket 42 provides an electrical connection between the substrates 21 and 24. If desired, the gasket 42 in addition to or instead of the post 27 may provide the electrical connection between the FBAR device 50 and the circuit 52. In such an embodiment, formation of the post 27 may be unnecessary.

Figure 9:
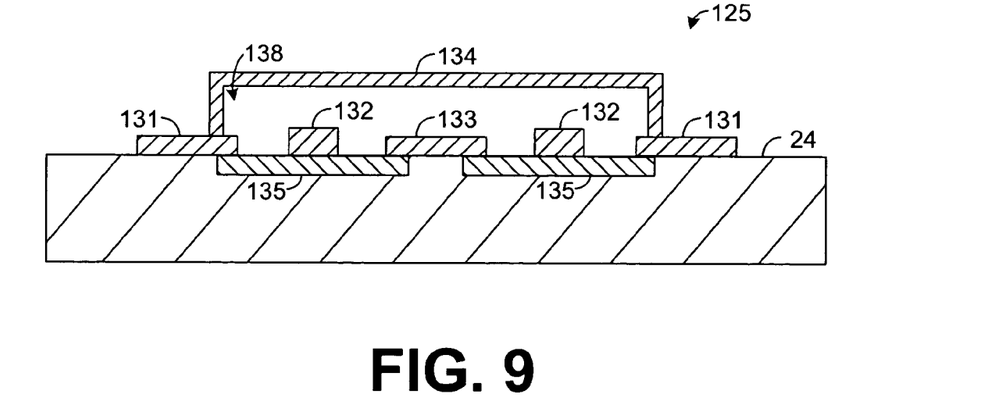
FIG. 9 is a cross-sectional view of a base substrate with a transistor formed on a surface of the base substrate.

As described above, in one exemplary embodiment, the circuit 52 may comprise a power amplifier for amplifying a signal. The amplified signal passes through the FBAR device 50 to the antenna (not shown). As an example, the FBAR device 50 may be configured as a duplexer described above, and the circuit 52 may be a power amplifier to amplify a signal being transmitted by the telephone. When the circuit 52 is a power amplifier, the circuit 52 is composed of several interconnected transistors. FIG. 9 depicts exemplary ones of such transistors 125 formed in and on substrate 24. The transistors 125 of FIG. 9 comprise source contacts 131, gate contacts 132, and a drain contact 133. The source contacts 131 are electrically connected to one another via a conductive bridge 134. A doped region 135, sometimes referred to as a channel, in the substrate 24 extends from the drain contact 133 to each of the source contacts 131. For each channel 135, a gate contact 132 is used to control the flow of electrons or holes between the drain contact 133 and a source contact 131. To reduce the capacitance of the bridge 134, an air gap 138 separates the bridge 134 from the substrate 24.

In various embodiments, such as embodiments in which the circuit 52 is a power amplifier, the material of the substrate 24 (FIG. 1) on which the circuit 52 is formed is gallium arsenide (GaAs). GaAs substrates have electrical properties that make them suitable for use in power amplifiers. Unfortunately, GaAs substrates are more expensive than many other substrates, such as silicon, and have much poorer thermal conductivity.

Further, although the FBAR device 50 can be formed on a GaAs substrate, the FBAR device 50 usually operates just as well fabricated on a less expensive substrate. Thus, in one exemplary embodiment, the substrate 24 is composed of GaAs, and the substrate 21 is composed of a material that is less expensive than GaAs. As an example, the substrate 21 may be composed of alumina ($Al_2O_3$). Alumina has adequate electrical and thermal properties for use as a substrate for the FBAR device 50, as well as other types of passive components. Further, alumina is significantly less expensive than GaAs, yet alumina has a temperature coefficient of expansion similar to that of GaAs. Thus, an alumina substrate 21 expands and contracts similarly to a GaAs substrate 24 due to temperature changes during manufacturing and operation. Accordingly, utilization of alumina for substrate 21 when the substrate 24 is composed of GaAs is not likely to produce significant thermal stresses within the device 15 during manufacturing and operation.

Forming the FBAR device 50 on the alumina substrate 21 instead of the GaAs substrate 24 leaves more of the surface area of the higher-cost GaAs substrate 24 for other components, such as circuit 52, that may benefit from the use of GaAs as a substrate material. Thus, forming the FBAR device 50 on the substrate 21 helps to reduce the cost and/or size of the device 15 by reducing the amount of GaAs material needed to form the substrate 24. Further, since the FBAR device 50 operates just as well on alumina as compared to GaAs, the foregoing cost and size benefit may be achieved without adversely affecting the performance of the FBAR device 50.

In addition, since the FBAR device 50, as well as other components of the substrates 21 and 24, are contained within a hermetic package formed by gasket 42 and substrates 21 and 24, it is unnecessary to encapsulate the components located on either of the substrates 21 or 24 with an encapsulating layer as is sometimes done with conventional devices. Thus, the cost and yield loss resulting from an encapsulating layer is eliminated from the manufacturing process of device 15. Also, excluding the encapsulating layer prevents the encapsulating material from filling exposed air gaps and/or cavities, such as the air gap 138 (FIG. 9), which reduces capacitance. Thus, in an embodiment in which the circuit 52 includes the transistors of FIG. 9, eliminating the encapsulating layer from the device improves the performance and reduces the cost of the circuit 52.

Referring again to FIG. 1, the lid substrate 21 on which the FBAR device 50 is formed provides mechanical support for base substrate 24 and increases the mechanical integrity of the device 15. The additional support provided by the substrate 21 reduces the mechanical burden placed on substrate 24 enabling this substrate 24 to be thinned to a greater extent. The more the substrate 24 is thinned, the better the substrate 24 is able to dissipate heat from the circuit 52. Indeed, provided that substrate 21 is able to provide adequate mechanical support, it is possible for the thinning of the substrate 24 to be limited by the precision of the thinning process rather than mechanical integrity concerns.

In this regard, to maintain the hermetic seal of the chamber 44, the substrate 24 is thinned to a minimum thickness sufficient to prevent breaches of the hermetic seal due to imperfections in the thinning process. Current back-lapping techniques are able to thin a substrate with precision of less than about 25 micrometers ($\mu m$). Thus, current back-lapping techniques can be used to reduce the thickness (measured in the y-direction) of the base substrate 24 to less than approximately 25 $\mu m$. This assumes that the substrate 21 provides sufficient mechanical support for the device 15 with such a thin base substrate 24. In contrast, the minimum thickness of substrates currently in common use is limited by mechanical integrity concerns and is usually at least approximately 120 $\mu m$.

Figure 10:
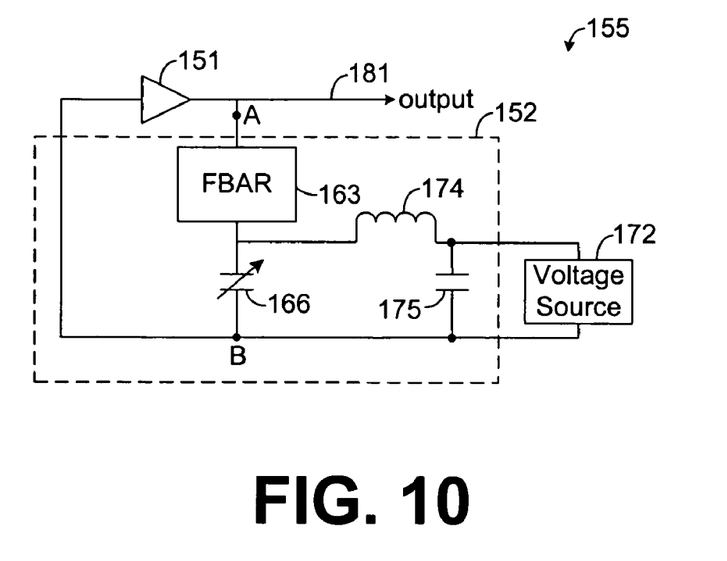
FIG. 10 is a diagram of an exemplary voltage controlled oscillator.

In one embodiment described above, the FBAR device 50 is configured as a duplexer. However, in other embodiments, the FBAR device 50 is configured as another type of device. For example, the FBAR device 50 may be configured as a tunable FBAR circuit 152 that forms part of a voltage controlled oscillator 155, as shown in FIG. 10. In such an embodiment, the tunable FBAR circuit 152 of FIG. 10 is located in the feedback path of an operational amplifier 151 and is composed of an FBAR 163 connected in series with a voltage-variable capacitor 166. Further, a voltage source 172 and an inductor 174 are connected in series across voltage-variable capacitor 166. The voltage source 172 is external and is variable to control the operating frequency of the tunable FBAR circuit 152. A bypass capacitor 175 connects the inductor 174 in parallel with the capacitor 166 at such operating frequency. Referring to FIGS. 1 and 10, the operational amplifier 151 constitutes at least part of the circuit 52 and, therefore, resides on substrate 24. Further, the tunable FBAR circuit 152 constitutes at least part of the FBAR device 50 and, therefore, resides on substrate 21.

The capacitance of the capacitor 166 is varied by varying the voltage of the voltage source 172. Voltage-variable capacitor 166 is typically implemented as a varactor. Further, the following copending and commonly-assigned patent applications describe tunable capacitors implemented as micro-electromechanical system (MEMS) devices that may be used as the voltage-variable capacitor 166: U.S. patent application Ser. No. 10/104,349, now U.S. Pat. No. 6,549,394, entitled "Micromachined Parallel-Plate Variable Capacitor with Plate Suspension," and filed on Mar. 22, 2002; U.S. patent application Ser. No. 10/458,131, now U.S. Pat. No. 6,853,534, entitled "Tunable Capacitor," and filed on Jun. 9, 2003; and U.S. patent application Ser. No. 10/458,005, entitled "Variable Capacitor having a Rigidity-Increasing Feature and Method for Forming Same," and filed on Jun 9, 2003. Each of the foregoing patent applications is incorporated herein by reference. Note that the capacitors described by the above-mentioned applications may be manufactured using processes similar to or compatible with those used to manufacture the FBAR 163. Thus, using the capacitors described by the above-mentioned patent applications may result in manufacturing efficiencies that reduce the overall cost of the voltage controlled oscillator 152.

In operation, the electronic amplifier 151 outputs a signal 181 that oscillates at the resonant frequency of the FBAR 163. Further, by varying the voltage provided by the voltage source 172, the capacitance of the voltage-variable capacitor 163 is varied to change the resonant frequency of the FBAR 163. Thus, as will be described in more detail below, the FBAR 163 can be tuned such that the signal 181 oscillates at a desired frequency.

Figure 11:
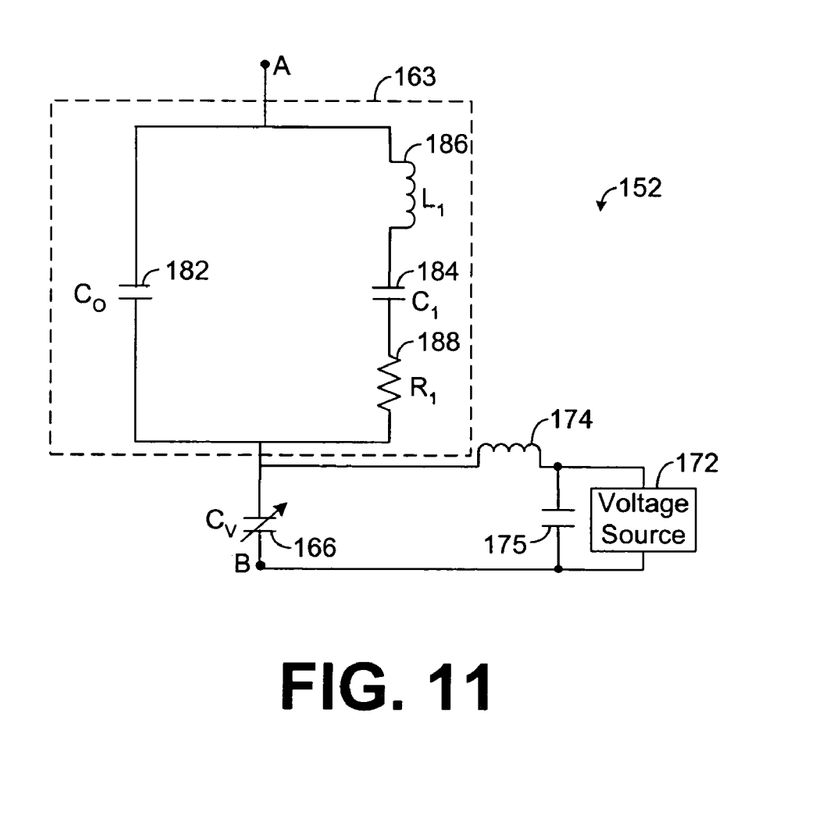
FIG. 11 is a circuit diagram of a tunable FBAR circuit within the voltage controlled oscillator of FIG. 10.

FIG. 11 depicts an equivalent circuit diagram for the tunable FBAR circuit 152 of FIG. 10. The FBAR 163 is represented by capacitors 182 and 184, an inductor 186, and a resistor 188. The capacitor 182 has a capacitance, $C_O$, and is connected in parallel with capacitor 184, inductor 186, and resistor 188 connected in series. The capacitor 184 has a capacitance, $C_1$, the inductor 186 has an inductance, $L_1$, and the resistor 184 has a resistance, $R_1$. $C_1$ is significantly smaller than Co. For example, in one embodiment, $C_1$ is approximately equal to $(C_O/20)$, and is determined by the material properties of the piezoelectric material and electrodes of the FBAR 163.

The FBAR 163 has a series resonance when the impedance of capacitor 184 substantially cancels the impedance of inductor 186. In this state, very little current passes through the capacitor 182, and $C_O$ can be neglected for series resonance conditions. Thus, the capacitance, CAB, measured between points A and B of FIG. 12, is represented by the following equation for the series resonance condition:

$$C_{AB} \cong \frac{C_1 C_v}{C_{1+} C_v}$$

where $C_v$ is the capacitance of the voltage-variable capacitor 166. Further, the series resonant frequency, $f_r$, is represented by the following equation:

$$f_r \cong 1/(2\pi\sqrt{L_1 C_{AB}})$$

As shown by the above equations, the resonant frequency, $f_r$, of the FBAR 163 can be varied by changing $C_v$, which is controlled by the voltage provided by the voltage source 172. Therefore, by controlling the voltage source 172, the resonant frequency of the FBAR 163 and, therefore, the oscillation frequency of the signal 181 output by the power amplifier 151 can be tuned such that the signal 181 oscillates at a desired frequency.

We claim:

1. A microfabricated device, comprising:
a first substrate;
a second substrate bonded to said first substrate to define a chamber;
a film bulk acoustic resonator (FBAR) device located on a surface of said first substrate inside said chamber;
an active circuit located on a surface of said second substrate inside said chamber; and
an electrical connection between said active circuit and said FBAR device, said electrical connection being configured to connect a signal between said FBAR device and said active circuit, and said active circuit being configured to process said signal.

2. The device of claim 1, further comprising a hermetic gasket between said first and second substrates, said gasket defining part of said chamber.

3. The device of claim 1, wherein: said circuit is configured to process a signal, and said electrical connection connects said signal from said active circuit to said FBAR device.

4. The device of claim 1, wherein said device constitutes part of a cellular telephone, said cellular telephone comprising an antenna electrically connected to said FBAR device.

5. The device of claim 4, wherein said active circuit comprises a power amplifier.

6. The device of claim 1, further comprising: an electrically conductive via extending through said first substrate; and an electrical connection between said via and said FBAR device.

7. The device of claim 6, further comprising: an electrically conductive via extending through said second substrate; and an electrical connection between said active circuit and said via extending through said second substrate.

8. The device of claim 1, wherein said second substrate has a thickness of less than approximately 150 micrometers.

9. The device of claim 1, wherein said first and second substrates comprise silicon.

10. The device of claim 1, wherein said second substrate comprises gallium arsenide.

11. The device of claim 10, wherein said first substrate comprises alumina.

12. The device of claim 1, wherein said FBAR device comprises a tunable FBAR circuit, said circuit comprising a voltage-variable capacitor electrically connected to an FBAR.

13. The device of claim 1, wherein said electrical connection hermetically seals said chamber.

14. The device of claim 1, wherein said electrical connection comprises compliant material that is coated with electrically conductive material.

15. The device of claim 14, wherein said compliant material comprises a polymer.

16. The device of claim 14, wherein said compliant material comprises a polyimide.

17. A microfabricated device, comprising:

a first substrate;

a second substrate bonded to said first substrate to define a chamber;

a film bulk acoustic resonator (FBAR) device located on a surface of said first substrate inside said chamber, said FBAR device comprising a tunable FBAR circuit, said tunable FBAR circuit comprising a voltage variable capacitor electrically connected to the FBAR;

an circuit located on a surface of said second substrate inside said chamber; and an electrical connection between said circuit and said FBAR device, wherein said circuit located on said surface of said second substrate comprises an operational amplifier, and wherein said tunable FBAR circuit is positioned within a feedback path of said operational amplifier.

18. A microfabricated device, comprising:

a first substrate;

a second substrate bonded to the first substrate to define a chamber;

a film bulk acoustic resonator (FBAR) device located over a surface of the first substrate inside the chamber;

an active circuit located on a surface of the second substrate inside the chamber, the active circuit configured to process a signal from the FBAR device; and an electrical connection between the active circuit and the FBAR device, wherein electrical connection hermetically seals the chamber.

* * * * *